United States Patent
Lin et al.

(10) Patent No.: US 11,552,113 B2
(45) Date of Patent: Jan. 10, 2023

(54) MOIRE PATTERN IMAGING DEVICE USING MICROLENS ARRAY AND PIXEL ARRAY TO FORM MOIRE PATTERN EFFECT

(71) Applicant: inFilm Optoelectronic Inc., Grand Cayman (KY)

(72) Inventors: Chih-Hsiung Lin, Grand Cayman (KY); Shih-Yuan Chang, Grand Cayman (KY)

(73) Assignee: inFilm Optoelectronic Inc., Grand Cayman (KY)

( * ) Notice: Subject to any disclaimer, the term of this patent is extended or adjusted under 35 U.S.C. 154(b) by 154 days.

(21) Appl. No.: 17/065,110

(22) Filed: Oct. 7, 2020

(65) Prior Publication Data

US 2021/0111206 A1    Apr. 15, 2021

(30) Foreign Application Priority Data

Oct. 9, 2019   (CN) .......................... 201910954705.X

(51) Int. Cl.
*H01L 27/146* (2006.01)
*G01B 11/25* (2006.01)
(Continued)

(52) U.S. Cl.
CPC ...... *H01L 27/14605* (2013.01); *G02B 3/0056* (2013.01); *G02B 13/0055* (2013.01);
(Continued)

(58) Field of Classification Search
CPC ........ H01L 27/14605; H01L 27/14627; G01B 11/254; G01B 11/25; G02B 3/0056;
(Continued)

(56) References Cited

U.S. PATENT DOCUMENTS 9,945,988 B2 *   4/2018   Powell ................... G02B 30/56
2006/0001855 A1   1/2006   Lof et al.
(Continued)

FOREIGN PATENT DOCUMENTS

CN    105547653 A    5/2016
CN    106597675 A    4/2017
(Continued)

*Primary Examiner* — Jennifer D Bennett
*Assistant Examiner* — Erin R Garber
(74) *Attorney, Agent, or Firm* — Rabin & Berdo, P.C.

(57) ABSTRACT

A moiré pattern imaging device includes a light-transmitting film and an optical sensor. The light-transmitting film includes a plurality of microlenses, and a light-incident surface and a light-exit surface opposite to each other. The plurality of microlenses are disposed on the light-incident surface, the light-exit surface or a combination thereof, and the plurality of microlenses are arranged in two dimensions to form a microlens array. The optical sensor includes a photosurface. The photosurface faces the light-exit surface of the light-transmitting film, the photosurface is provided with a plurality of pixels, and the plurality of pixels are arranged in two dimensions to form a pixel array. The microlens array and the pixel array correspondingly form a moiré pattern effect to produce an imaging magnification effect, and the photosurface of the optical sensor senses light and forms a moiré pattern magnification image.

8 Claims, 7 Drawing Sheets

(51) Int. Cl.
  *G02B 3/00* (2006.01)
  *G02B 27/60* (2006.01)
  *H04N 5/225* (2006.01)
  *G02B 13/00* (2006.01)

(52) U.S. Cl.
  CPC ......... *G02B 13/0085* (2013.01); *G02B 27/60* (2013.01); *H01L 27/14627* (2013.01); *H04N 5/2254* (2013.01); *H04N 5/22541* (2018.08); *G01B 11/254* (2013.01); *G02B 3/0062* (2013.01)

(58) Field of Classification Search
  CPC .. G02B 3/0062; G02B 27/60; G02B 13/0085; G02B 13/0055; G02B 7/34; H04N 5/22541; H04N 5/2254; H04N 5/232127
  See application file for complete search history.

(56) References Cited

U.S. PATENT DOCUMENTS

| | | | | |
|---|---|---|---|---|
| 2013/0194482 | A1* | 8/2013 | Nicol | G06F 30/00 348/340 |
| 2017/0113481 | A1* | 4/2017 | Hersch | G02B 3/0043 |
| 2018/0095275 | A1* | 4/2018 | Nakajima | G02B 7/08 |
| 2018/0166489 | A1* | 6/2018 | Sao | H01L 27/14685 |

FOREIGN PATENT DOCUMENTS

| | | |
|---|---|---|
| CN | 108616677 A | 10/2018 |
| CN | 108886561 A | 11/2018 |
| CN | 110140348 A | 8/2019 |
| TW | 201822145 A | 6/2018 |
| TW | 201841003 A | 11/2018 |

\* cited by examiner

MOIRÉ PATTERN IMAGING DEVICE USING MICROLENS ARRAY AND PIXEL ARRAY TO FORM MOIRÉ PATTERN EFFECT

CROSS-REFERENCE TO RELATED APPLICATION

This non-provisional application claims priority under 35 U.S.C. § 119(a) to Patent Application No. 201910954705.X filed in China, P.R.C. on Oct. 9, 2019, the entire contents of which are hereby incorporated by reference.

BACKGROUND

Technical Field

The instant disclosure relates to an imaging device, and in particular, to a moiré pattern imaging device.

Related Art

With the rapid development of multimedia technologies, many electronic devices (such as smartphones, tablet computers, notebook computers or digital cameras) are equipped with optical lens assemblies, for example, the optical lens assembly may be a wide-angle lens assembly, a fisheye lens assembly or a zoom lens assembly, to support functions such as photography, online video or face recognition.

However, at present, the optical lens assembly on the market is usually composed of a plurality of optical lenses. For example, the optical lens may be a concave lens or a convex lens. As a result, the optical lens assembly cannot be further thinned. For example, the thicknesses of most of the optical lenses of the smartphones and the tablet computers are more than 5 mm, and the thicknesses of most of the optical lens assemblies of the digital cameras are more than 50 mm, which is adverse to the thinning development of the electronic devices.

SUMMARY

In view of the above, in an embodiment, a moiré pattern imaging device is provided, including a light-transmitting film and an optical sensor. The light-transmitting film includes a plurality of microlenses, and a light-incident surface and a light-exit surface opposite to each other. The plurality of microlenses are disposed on the light-incident surface, the light-exit surface or a combination thereof, and the plurality of microlenses are arranged in two dimensions to form a microlens array. The optical sensor includes a photosurface. The photosurface faces the light-exit surface of the light-transmitting film, the photosurface is provided with a plurality of pixels, and the plurality of pixels are arranged in two dimensions to form a pixel array. The microlens array and the pixel array correspondingly form a moiré pattern effect to produce an imaging magnification effect, and the photosurface of the optical sensor senses light and forms a moiré pattern magnification image.

As above, the moiré pattern imaging device in the embodiments of the instant disclosure disposes the microlens array on the light-transmitting film, so that the moiré pattern effect can be formed between the microlens array and the pixel array of the optical sensor, and therefore the imaging magnification effect is achieved. Therefore, overall design of the moiré pattern imaging device can be greatly thinned. For example, the thickness of the light-transmitting film may be 5 μm to 1000 μm, which is greatly less than the thickness of the current optical lens assembly on the market. The above thickness range of the light-transmitting film is merely an example, and the actual thickness of the light-transmitting film depends on a product using the moiré pattern imaging device.

DETAILED DESCRIPTION

Figure 1:
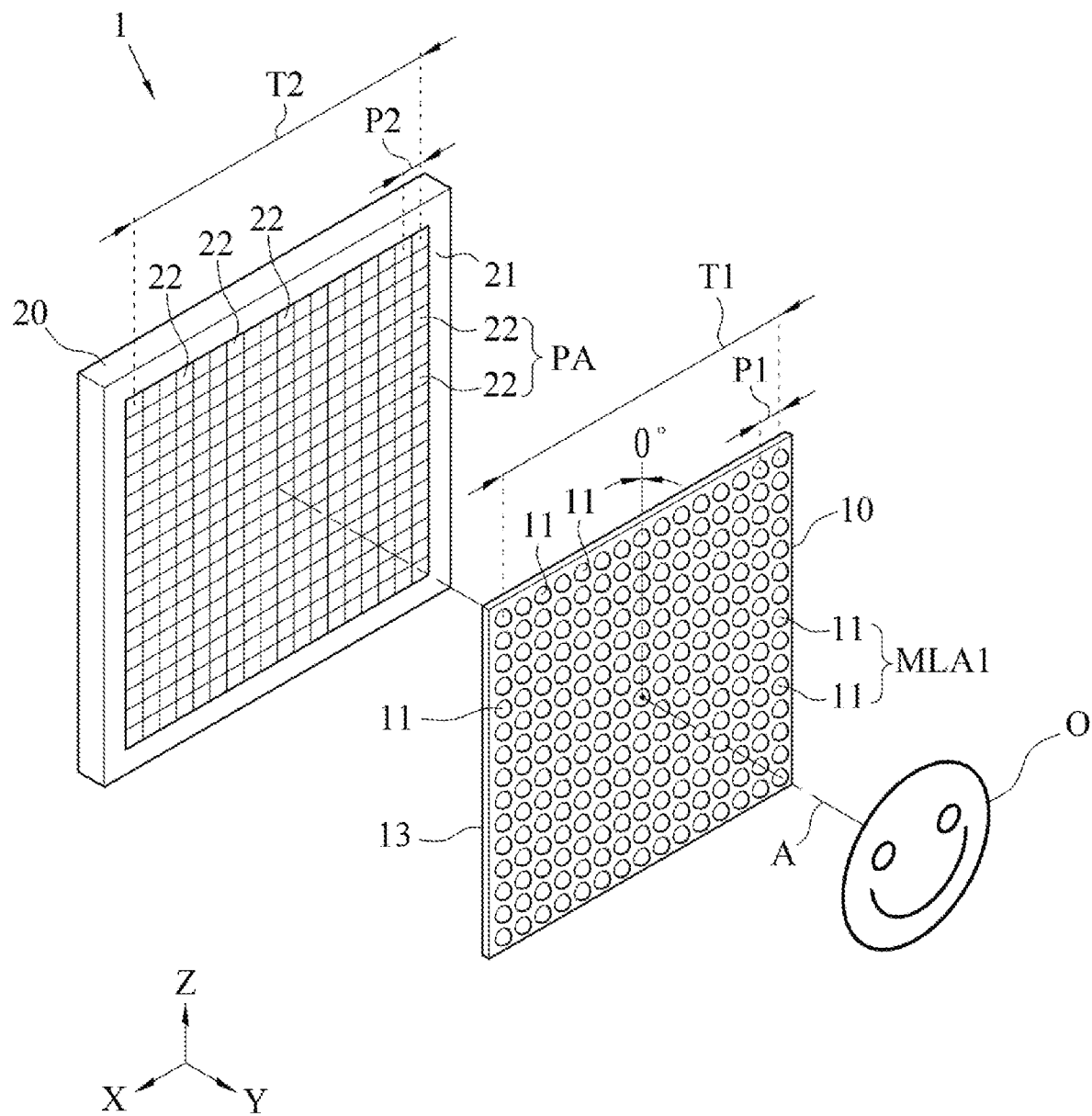
FIG. 1 illustrates a three-dimensional view of a first embodiment of a moiré pattern imaging device according to the instant disclosure.

The following provides detailed descriptions of various embodiments. However, the embodiments are merely used as an example for description and are not intended to narrow the protection scope of the instant disclosure. In addition, some elements may be omitted in the drawings in the embodiments, to clearly show technical features of the instant disclosure. Identical labels in all accompanying drawings are used to represent the same or similar elements.

Figure 2:
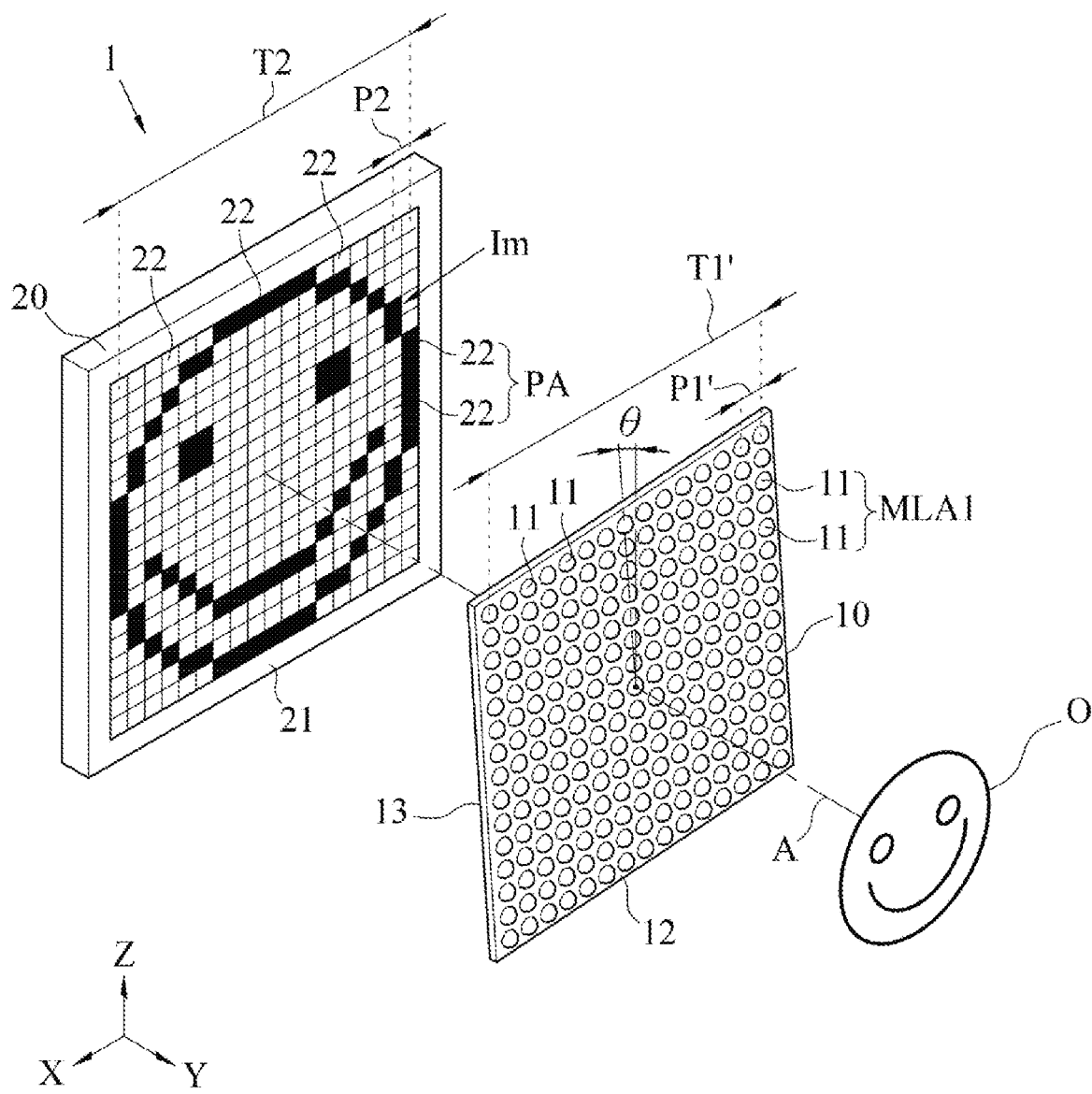
FIG. 2 illustrates a schematic imaging diagram of a first embodiment of a moiré pattern imaging device according to the instant disclosure.
Figure 3:
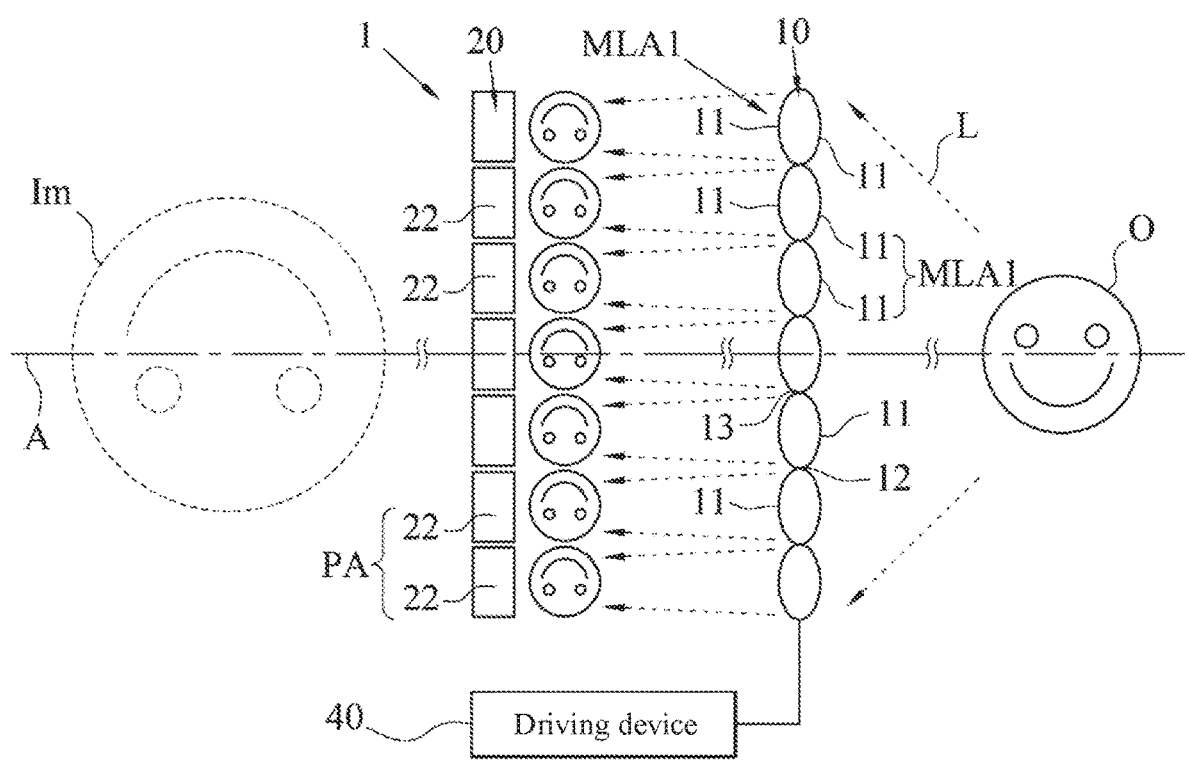
FIG. 3 illustrates a schematic planar diagram of a first embodiment of a moiré pattern imaging device according to the instant disclosure.

FIG. 1 is a three-dimensional view of a first embodiment of a moiré pattern imaging device according to the instant disclosure, FIG. 2 is a schematic imaging diagram of the first embodiment of the moiré pattern imaging device according to the instant disclosure, and FIG. 3 is a schematic planar diagram of the first embodiment of the moiré pattern imaging device according to the instant disclosure. As shown in FIG. 1 to FIG. 3, a moiré pattern imaging device 1 in this embodiment of the instant disclosure includes a light-transmitting film 10 and an optical sensor 20. The moiré pattern imaging device 1 may be applied to various electronic products (such as smartphones, tablet computers, notebook computers, digital cameras or video cameras) to obtain images through sensing.

As shown in FIG. 1 to FIG. 3, the light-transmitting film 10 of the moiré pattern imaging device 1 is provided with a microlens array MLA1, and the optical sensor 20 is provided with a pixel array PA. The microlens array MLA1 of the light-transmitting film 10 and the pixel array PA of the optical sensor 20 may correspondingly form a moiré pattern effect to produce an imaging magnification effect. For example, the microlens array MLA1 and the pixel array PA may form the above moiré pattern effect in various manners, for example, using different array periods, setting a specific angle, or relative movement. Such manners are respectively described in detail below.

As shown in FIG. 1 to FIG. 3, the light-transmitting film 10 may be a film or a sheet made of a light-transmitting material. For example, the light-transmitting material may be polycarbonate (PC) or acrylic plastic (PMMA), and the thickness of the light-transmitting film 10 may be 5 μm to 1000 μm. However, the above light-transmitting material and thickness of the light-transmitting film 10 are merely examples, and the instant disclosure is not actually limited thereto.

As shown in FIG. 1 to FIG. 3, the light-transmitting film 10 includes a plurality of microlenses 11 and two surfaces opposite to each other (a light-incident surface 12 and a light-exit surface 13). The light-incident surface 12 is configured to receive light from the outside (for example, object light produced by an external object) and emit light from the light-exit surface 13. The plurality of microlenses 11 may be disposed on the light-incident surface 12 or the light-exit surface 13, or the light-incident surface 12 and the light-exit surface 13 are both provided with a plurality of microlenses 11. For example, in this embodiment, the plurality of microlenses 11 are disposed on the light-incident surface 12 and the light-exit surface 13 of the light-transmitting film 10. The plurality of microlenses 11 on the light-incident surface 12 and the plurality of microlenses 11 on the light-exit surface 13 correspond to each other and are arranged in two dimensions, and the microlens arrays MLA1 are formed on the light-incident surface 12 and the light-exit surface 13 respectively.

In some embodiments, a size of each microlens 11 of the above microlens array MLA1 may be 2 μm to 2000 μm. A material of each microlens 11 is a transparent material such as fused silica, optical glass or transparent plastic. Each microlens 11 may be a columnar lens, a convex lens or a concave lens, or other types of optical lenses. For example, in the embodiment in FIG. 3, each microlens 11 is a convex lens. The plurality of microlenses 11 of the microlens array MLA1 have a first array period P1 (as shown in FIG. 1), and the first array period P1 may refer to a spacing distance between the plurality of microlenses 11 (for example, a spacing distance between centers of the two adjacent microlenses 11). In some embodiments, the first array period P1 may be 2 μm to 2000 μm. The plurality of microlenses 11 of the microlens array MLA1 may be integrally manufactured with the light-transmitting film 10, or the plurality of microlenses 11 may be manufactured in other processing manners. For example, the processing manner may be screen printing, relief casting, photoresist reflux, micro-injection molding, hot embossing or the like. However, the size, the array period or the processing manner of the above microlens 11 is merely an example, and specifically depends on a product using the moiré pattern imaging device 1.

As shown in FIG. 1 to FIG. 3, the optical sensor 20 has a photosurface 21. A spacing distance is kept between the optical sensor 20 and the light-transmitting film 10, and the photosurface 21 faces the light-exit surface 13 of the light-transmitting film 10, so that the light from the light-exit surface 13 can be transmitted to the photosurface 21 of the optical sensor 20. In this embodiment, the photosurface 21 of the optical sensor 20 is provided with a plurality of pixels 22, and the plurality of pixels 22 are arranged in two dimensions to form the pixel array PA. In some embodiments, the above optical sensor 20 may be specifically a photosensitive element such as a charge-coupled device (CCD), a complementary metal-oxide semiconductor (CMOS) or a CMOS active pixel sensor.

As shown in FIG. 1 to FIG. 3, the plurality of pixels 22 of the photosurface 21 of the optical sensor 20 have a second array period P2. The second array period P2 may refer to a spacing distance between the plurality of pixels 22 (for example, a spacing distance between centers of the two adjacent pixels 22), and the pixel array PA of the optical sensor 20 and the microlens array MLA1 of the light-transmitting film 10 may coaxially correspond to each other. For example, in this embodiment, the light-transmitting film 10 has an optical axis A, and the optical sensor 20 and the light-transmitting film 10 are coaxially disposed with the optical axis A, so that the pixel array PA and the microlens array MLA1 correspond to each other.

Then, as shown in FIG. 2, in this embodiment, a specific angle θ is set between the microlens array MLA1 of the light-transmitting film 10 and the pixel array PA of the optical sensor 20, so that a periodic difference is produced and the moiré pattern effect is formed between the microlens array MLA1 and the pixel array PA to produce the imaging magnification effect, and therefore the photosurface 21 of the optical sensor 20 senses light to form a moiré pattern magnification image Im. Details are described as follows.

As shown in FIG. 1, in this embodiment, the first array period P1 of the plurality of microlenses 11 of the microlens array MLA1 is same as the second array period P2 of the plurality of pixels 22 of the pixel array PA, so that the microlens array MLA1 and the pixel array PA have the same spatial frequency or similar spatial frequencies. When the specific angle θ (such as 0.1°, 1° or 2°) is set between the microlens array MLA1 and the pixel array PA, a beat frequency is produced between the microlens array MLA1 and the pixel array PA to form the moiré pattern effect. Referring to FIG. 1 and FIG. 2, the light-transmitting film 10 rotates by the specific angle θ relative to the optical sensor 20 with the optical axis A as a center, so that the specific angle θ is set between the microlens array MLA1 and the pixel array PA.

In some embodiments, the specific angle θ set between the microlens array MLA1 and pixel array PA may enable the periodic difference to be produced between the microlens array MLA1 and the pixel array PA, and the periodic difference is less than the array period of the pixel array PA. For example, as shown in FIG. 1, before the light-transmitting film 10 rotates, the first array period P1 of the plurality of microlenses 11 of the microlens array MLA1 is same as the second array period P2 of the plurality of pixels 22 of the pixel array PA. A period total T1 of a plurality of first array periods P1 forming the microlens array MLA1 in a uniaxial direction (an X-axis direction herein, or a Y-axis direction) is equal to a period total T2 of a plurality of second array periods P2 of the pixel array PA in the uniaxial direction (the X-axis direction herein, or the Y-axis direction). Then, as shown in FIG. 2, when the light-transmitting film 10 rotates by the specific angle θ relative to the optical sensor 20 with the optical axis A as a center so that the specific angle θ is set between the microlens array MLA1 and the pixel array PA, a first array period P1' of the plurality of microlenses 11 of the microlens array MLA1 in the uniaxial direction (the X-axis direction herein) decreases, so that a period total T1' of a plurality of the first array periods P1' of the microlens array MLA1 decreases relatively and is different from the period total T2 of the pixel array PA. The above periodic difference may refer to a difference between the period total T1' of the microlens array MLA1 and the period total T2 of the pixel array PA, and the periodic difference is less than the second array period P2 of the pixel array PA or the first array period P1 of the microlens array MLA1, so that the moiré pattern effect is formed between the microlens array MLA1 and the pixel array PA to produce the imaging magnification effect.

Based on the above, as shown in FIG. 1 and FIG. 3, in a process of image shooting or acquisition with the moiré pattern imaging device 1, object light L produced by an external object O (in this embodiment, the external object O is represented by a smiling face) may enter the inside of the light-transmitting film 10 from the light-incident surface 12 of the light-transmitting film 10. Because the light-transmitting film 10 is provided with the microlens array MLA1, as shown in FIG. 3, the object light L is emitted from the light-exit surface 13 after being refracted by the plurality of microlenses 11, and is transmitted to the plurality of pixels 22 respectively, so that the plurality of pixels 22 sense light and obtain a plurality of photosensitivity values respectively. In this embodiment, the photosensitivity value obtained by each pixel 22 is represented by a small smiling face. Actually, each photosensitivity value above refers to a gray-scale value, an RGB value, a CMYK value or the like. Referring to FIG. 2 and FIG. 3 again, when the specific angle θ is set between the microlens array MLA1 and the pixel array PA to form the moiré pattern effect, the plurality of photosensitivity values obtained by the plurality of pixels 22 through light sensing may jointly form the moiré pattern magnification image Im corresponding to the external object O (as shown in FIG. 2, the moiré pattern magnification image Im herein is an imaging magnification effect achieved by magnifying the smiling face image). For example, if the photosensitivity value obtained by each pixel 22 through light sensing is the gray-scale value, each photosensitivity value may be represented by an intensity from 0 (black) to 255 (white), where values from 0 to 255 represent different grey scales. The plurality of photosensitivity values of different intensities are arranged and combined to jointly form the moiré pattern magnification image Im. Similarly, when the photosensitivity value obtained by each pixel 22 through light sensing is the RGB value, the plurality of photosensitivity values of different colors may be arranged and combined to jointly form the colored moiré pattern magnification image Im. Specifically, the above moiré pattern magnification image Im refers to a magnification image corresponding to the external object O produced after the object light L enters the light-transmitting film 10 from the light-incident surface 12 and light is emitted from the light-exit surface 13 of the light-transmitting film 10 to the photosurface 21 of the optical sensor 20 through the moiré pattern effect.

In some embodiments, the above moiré pattern magnification image Im may be an upright or upside-down image, which depends on the specific angle θ set between the microlens array MLA1 and the pixel array PA. For example, when the specific angle θ set between the microlens array MLA1 and the pixel array PA is a positive value (such as 0.1°, 1° or 2°), the corresponding produced moiré pattern magnification image Im is the upright image; when the specific angle θ set between the microlens array MLA1 and the pixel array PA is a negative value (such as −0.1°, −1° or −2°), the corresponding produced moiré pattern magnification image Im is the upside-down image.

As shown in FIG. 3, the moiré pattern imaging device 1 may include a driving device 40. The driving device 40 is connected to the light-transmitting film 10 to drive the light-transmitting film 10 to rotate relative to the optical axis A, so that different angles can be set between the microlens array MLA1 and the pixel array PA to form different moiré pattern effects to produce the moiré pattern magnification images Im with different magnifications. For example, the driving device 40 may include a driving motor, and a corresponding transmission mechanism may be disposed between the driving device 40 and the light-transmitting film 10. For example, the transmission mechanism is a gear transmission mechanism, a worm and worm wheel mechanism or a cam mechanism, and is connected to the driving motor, so that the light-transmitting film 10 is driven by the driving motor and the transmission mechanism to rotate relative to the optical axis A and the optical sensor 20.

Figure 4:
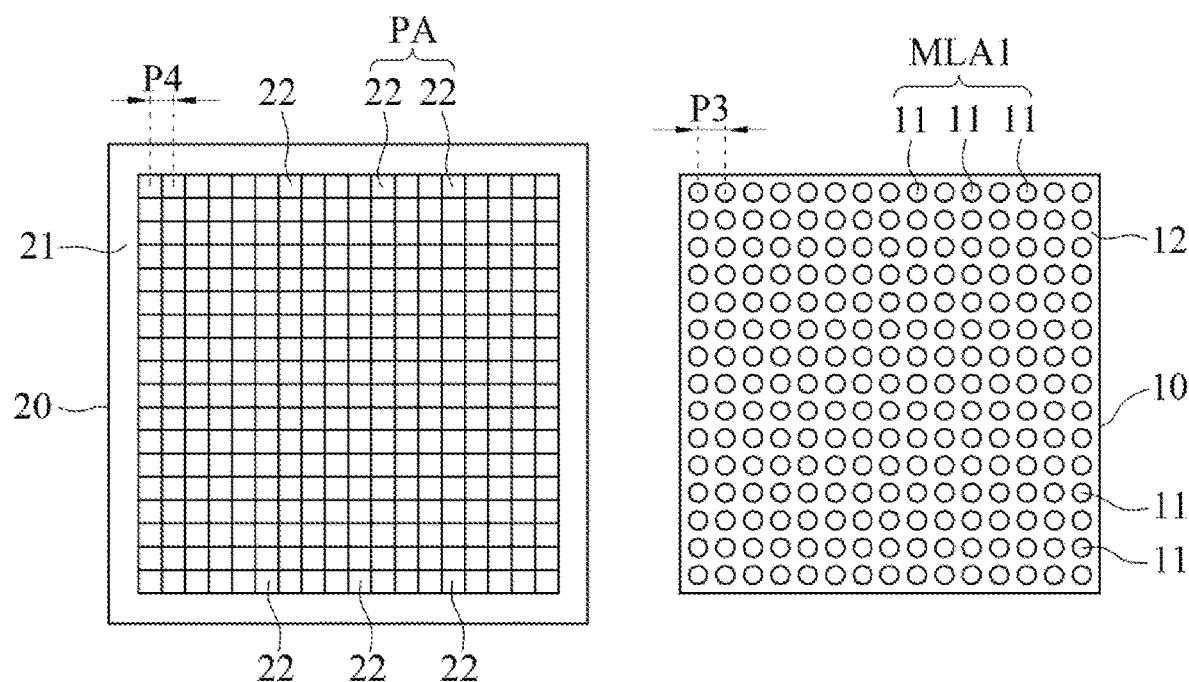
FIG. 4 illustrates a schematic planar diagram of a second embodiment of a moiré pattern imaging device according to the instant disclosure.

FIG. 4 is a schematic planar diagram of a second embodiment of a moiré pattern imaging device according to the instant disclosure. This embodiment and the above first embodiment have at least the following difference: in this embodiment, a plurality of microlenses 11 on a light-transmitting film 10 of a moiré pattern imaging device 2 have a first array period P3, a plurality of pixels 22 on a photosurface 21 of an optical sensor 20 have a second array period P4, and the first array period P3 is different from the second array period P4 (for example, in this embodiment, the first array period P3 is greater than the second array period P4, but the instant disclosure is not limited thereto), so that a microlens array MLA1 and a pixel array PA have different spatial frequencies. Therefore, a beat frequency can be formed to produce a moiré pattern effect without setting an angle or a relative movement between the microlens array MLA1 and the pixel array PA, thus achieving an imaging magnification effect.

Figure 5:
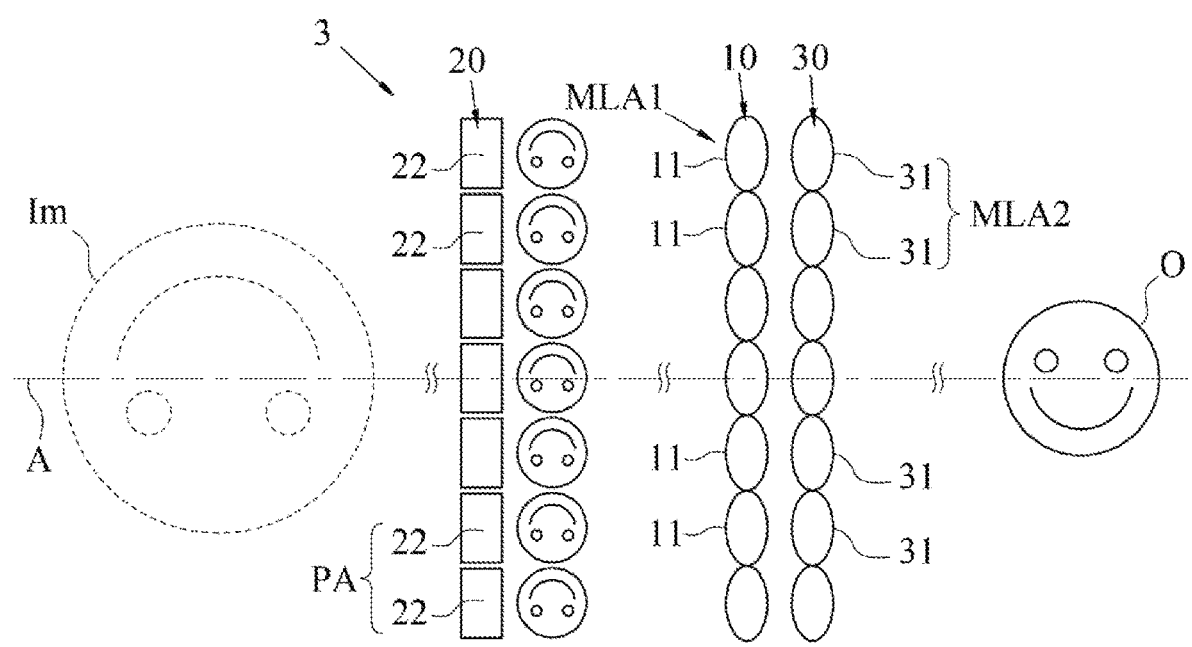
FIG. 5 illustrates a schematic planar diagram of a third embodiment of a moiré pattern imaging device according to the instant disclosure.

FIG. 5 is a schematic planar diagram of a third embodiment of a moiré pattern imaging device according to the instant disclosure. This embodiment and the above first embodiment have at least the following difference: in this embodiment, a moiré pattern imaging device 3 further includes at least one light-transmitting membrane 30 (one light-transmitting membrane 30 herein, or actually a plurality of light-transmitting membranes 30), and the light-transmitting membrane 30 and a light-transmitting film 10 are coaxially disposed. In this embodiment, the light-transmitting film 10 is between the light-transmitting membrane 30 and an optical sensor 20, the light-transmitting membrane 30 is provided with a plurality of lens units 31, the plurality of lens units 31 are arranged in two dimensions to form an array lens group MLA2, and the plurality of lens units 31 of the array lens group MLA2 respectively correspond to a plurality of microlenses 11 of a microlens array MLA1. For example, the plurality of lens units 31 and the plurality of microlenses 11 have the same array periods and therefore correspond to each other.

In some embodiments, a structure of the light-transmitting membrane 30 and a structure of the light-transmitting film 10 may be the same or different. For example, as shown in FIG. 5, in this embodiment, the structures of the light-transmitting membrane 30 and the light-transmitting film 10 are the same. Specifically, the light-transmitting membrane 30 and the light-transmitting film 10 are also films or sheets made of a light-transmitting material, and the plurality of lens units 31 are microlenses and disposed on two opposite surfaces of the light-transmitting membrane 30. Therefore, different light refraction effects may be produced by overlaying the light-transmitting membrane 30 with the light-transmitting film 10, so that after the moiré pattern effect is formed between the pixel array PA and the microlens array MLA1 as well as the array lens group MLA2, the moiré pattern magnification images Im with different optical magnification effects can be produced. In some embodiments, the structures of the light-transmitting membrane 30 and the light-transmitting film 10 may be different. For example, each lens unit 31 of the light-transmitting membrane 30 may be a concave lens or other lenses, or the light-transmitting membrane 30 may be provided with the plurality of lens units 31 on only one surface, to produce different optical magnification effects.

Figure 6:
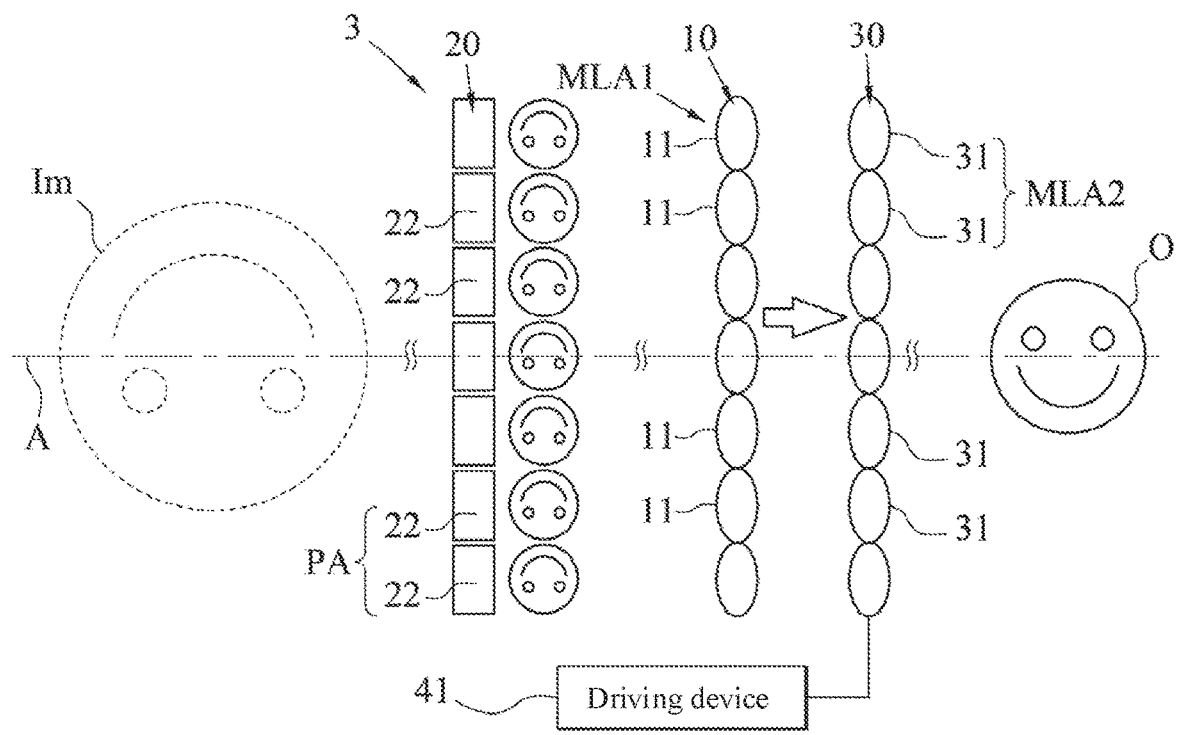
FIG. 6 illustrates an action diagram of a third embodiment of a moiré pattern imaging device according to the instant disclosure.
Figure 7:
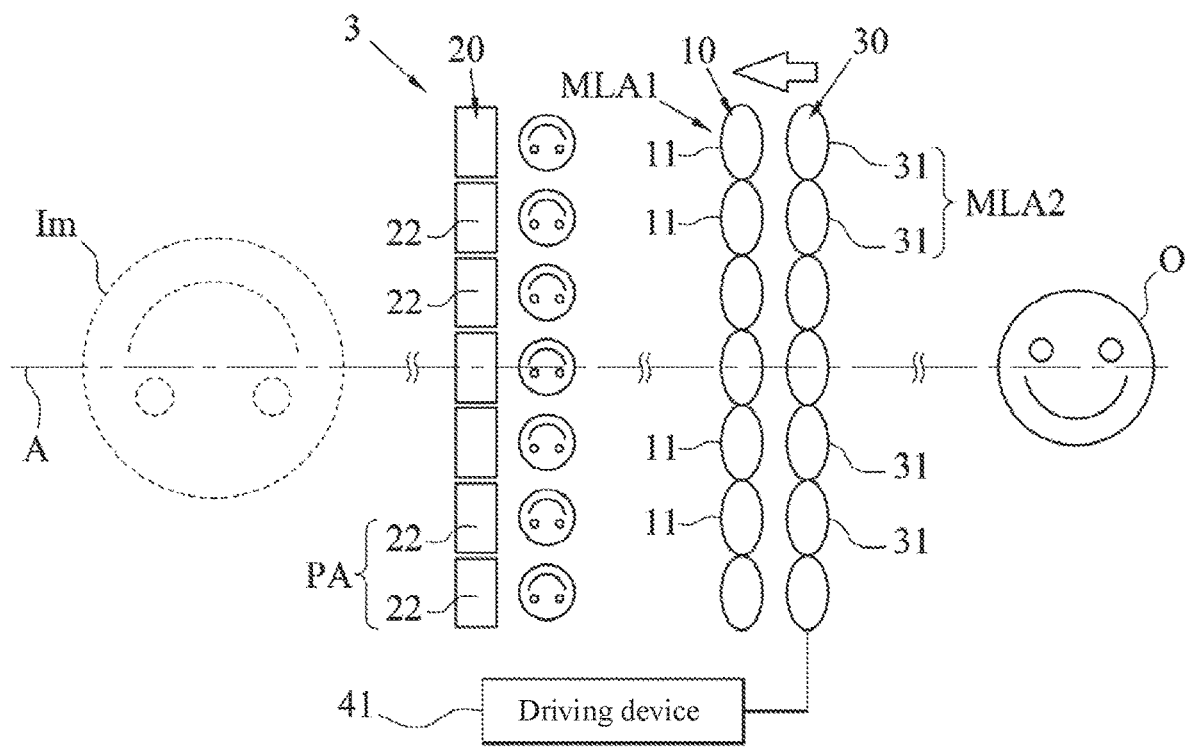
FIG. 7 illustrates another action diagram of a third embodiment of a moiré pattern imaging device according to the instant disclosure.

Referring to FIG. 5, FIG. 6 and FIG. 7, in some embodiments, the light-transmitting membrane 30 and the light-transmitting film 10 may axially move relative to each other to further produce a zoom in/out effect on the moiré pattern magnification image Im. For example, when the light-transmitting membrane 30 moves away from the optical sensor 20 and the light-transmitting film 10 to a first position, the moiré pattern magnification image Im may have a first magnification; when the light-transmitting membrane 30 moves close to the optical sensor 20 and the light-transmitting film 10 to a second position, the moiré pattern magnification image Im may have a second magnification different from the above first magnification. For example, as shown in FIG. 6, in a process of the light-transmitting membrane 30 moving away from the optical sensor 20 and the light-transmitting film 10, a magnification of the moiré pattern magnification image Im may gradually increase; as shown in FIG. 7, in a process of the light-transmitting membrane 30 moving close to the optical sensor 20 and the light-transmitting film 10, a magnification of the moiré pattern magnification image Im may gradually decrease. In this way, the zoom in/out effect is produced.

As shown in FIG. 6 and FIG. 7 again, in this embodiment, the moiré pattern imaging device 3 further includes a driving device 41. The driving device 41 is connected to at least one of the light-transmitting membrane 30 and the light-transmitting film 10 (the driving device 41 is connected to the light-transmitting membrane 30 herein) to drive the light-transmitting membrane 30 and the light-transmitting film 10 to axially move relative to each other. For example, the driving device 41 may include a driving motor, and a corresponding transmission mechanism may be disposed between the driving device 41 and the light-transmitting membrane 30. For example, the transmission mechanism is a gear transmission mechanism, a worm and worm wheel mechanism or a cam mechanism, and is connected to the driving motor, so that the light-transmitting membrane 30 is driven by the driving motor and the transmission mechanism to axially move relative to the light-transmitting film 10. In this way, the light-transmitting film 10 and the light-transmitting membrane 30 are close to or away from each other to produce the zoom in/out effect on the above moiré pattern magnification image Im.

Figure 8:
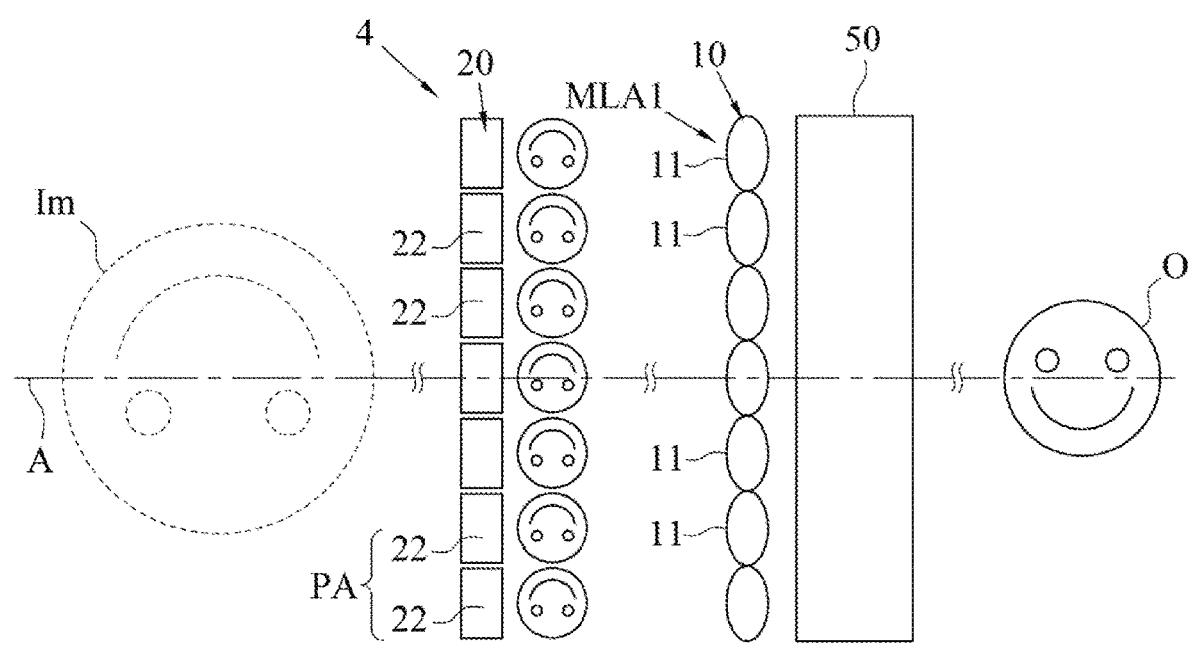
FIG. 8 illustrates a schematic planar diagram of a fourth embodiment of a moiré pattern imaging device according to the instant disclosure.

FIG. 8 is a schematic planar diagram of a fourth embodiment of a moiré pattern imaging device according to the instant disclosure. This embodiment and the above first embodiment have at least the following difference: in this embodiment, a moiré pattern imaging device 4 further includes an optical lens 50, and the optical lens 50 and a light-transmitting film 10 are coaxially disposed. For example, the optical lens 50 may be a conventional lens, such as a convex lens, a concave lens or other lenses, and a size of the optical lens 50 may be approximately the same as the light-transmitting film 10, but the instant disclosure is not limited thereto. Therefore, different light refraction effects may be produced by overlaying the optical lens 50 with the light-transmitting film 10, so that after the moiré pattern effect is formed between the pixel array PA and microlens array MLA1, the moiré pattern magnification images Im with different optical magnification effects can be produced.

Based on the above, in the moiré pattern imaging device 1 in the embodiments of the instant disclosure, the microlens array MLA1 is disposed on the light-transmitting film 10, so that the moiré pattern effect is formed between the microlens array MLA1 and the pixel array PA of the optical sensor 20, to achieve the imaging magnification effect and maintain existing image shooting and acquisition functions. Moreover, overall design of the moiré pattern imaging device 1 can be greatly thinned, and the thickness thereof is far less than the thickness of the current optical lens assembly on the market.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:
1. A moiré pattern imaging device, comprising:
   a light-transmitting film, comprising a plurality of microlenses, and a light-incident surface and a light-exit surface opposite to each other, the microlenses being disposed on the light-incident surface, the light-exit surface or a combination thereof, and the microlenses being arranged in two dimensions to form a microlens array; and
   an optical sensor, comprising a photosurface, the photosurface facing the light-exit surface of the light-transmitting film, the photosurface being provided with a plurality of pixels, and the pixels being arranged in two dimensions to form a pixel array; wherein
   the microlens array and the pixel array correspondingly form a moiré pattern effect to produce an imaging magnification effect, and the photosurface of the optical sensor senses light and forms a moiré pattern magnification image;
   the light-transmitting film has an optical axis, the optical sensor and the light-transmitting film are coaxially disposed with the optical axis, and a specific angle is set between the microlens array and the pixel array to enable the microlens array and the pixel array to form the moiré pattern effect; and
   the specific angle enables a periodic difference to be produced between the microlens array and the pixel array, the periodic difference is less than an array period of the pixel array, and the array period is a center spacing distance between the two adjacent pixels.

2. The moiré pattern imaging device according to claim 1, wherein the pixels of the photosurface of the optical sensor respectively sense light corresponding to the microlenses to obtain a plurality of photosensitivity values, and the photosensitivity values jointly form the moiré pattern magnification image.

3. The moiré pattern imaging device according to claim 1, further comprising a driving device, wherein the driving device is connected to the light-transmitting film to drive the light-transmitting film to rotate relative to the optical axis.

4. The moiré pattern imaging device according to claim 1, wherein the microlenses of the microlens array have a first array period, the pixels of the pixel array have a second array period, and the first array period is different from the second array period.

5. The moiré pattern imaging device according to claim 1, further comprising a light-transmitting membrane, wherein the light-transmitting membrane and the light-transmitting film are coaxially disposed, the light-transmitting membrane is provided with a plurality of lens units, the lens units are arranged in two dimensions to form an array lens group, and the array lens group corresponds to the microlens array.

6. The moiré pattern imaging device according to claim 5, wherein the light-transmitting membrane and the light-transmitting film selectively axially move relative to each other to a first position or a second position, the first position enables the moiré pattern magnification image to have a first magnification, the second position enables the moiré pattern magnification image to have a second magnification, and the first magnification is different from the second magnification.

7. The moiré pattern imaging device according to claim 6, further comprising a driving device, wherein the driving device is connected to at least one of the light-transmitting membrane and the light-transmitting film to drive the light-transmitting membrane and the light-transmitting film to axially move relative to each other.

8. The moiré pattern imaging device according to claim 1, further comprising an optical lens, wherein the optical lens and the light-transmitting film are coaxially disposed.

\* \* \* \* \*